United States Patent
Hwang et al.

(10) Patent No.: US 6,728,325 B1
(45) Date of Patent: Apr. 27, 2004

(54) METHOD AND APPARATUS FOR MIXING DOWN AND SPECTRUM FOLDING FREQUENCY DIVERSE MODULATED CARRIER

(75) Inventors: Chien-Meen Hwang, San Jose, CA (US); Eugen Gershon, San Jose, CA (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/497,030

(22) Filed: Feb. 2, 2000

(51) Int. Cl.[7] .................. H04L 7/00; H04L 27/22; G06F 17/17
(52) U.S. Cl. .................. 375/355; 375/329; 329/304; 708/313
(58) Field of Search .................. 375/261, 279–281, 375/283, 329–332, 344, 350, 355; 329/304–310; 708/313

(56) References Cited

U.S. PATENT DOCUMENTS

| | | | | |
|---|---|---|---|---|
| 4,785,463 A | * | 11/1988 | Janc et al. .................. 375/147 |
| 5,504,455 A | * | 4/1996 | Inkol .................. 329/304 |
| 5,621,345 A | * | 4/1997 | Lee et al. .................. 327/254 |
| 5,732,337 A | * | 3/1998 | Wargnier et al. .................. 455/144 |
| 5,754,601 A | * | 5/1998 | Horng et al. .................. 375/350 |
| 5,787,125 A | * | 7/1998 | Mittel .................. 375/329 |
| 5,872,480 A | * | 2/1999 | Huang .................. 329/304 |
| 5,878,088 A | * | 3/1999 | Knutson et al. .................. 375/324 |
| 6,067,329 A | * | 5/2000 | Kato et al. .................. 375/321 |
| 6,243,430 B1 | * | 6/2001 | Mathe .................. 375/346 |
| 6,256,358 B1 | * | 7/2001 | Whikehart et al. .................. 375/316 |
| 6,651,078 B1 | * | 11/2003 | Gershon et al. .................. 708/313 |

* cited by examiner

*Primary Examiner*—Young T. Tse
(74) *Attorney, Agent, or Firm*—Renner, Otto, Boisselle & Sklar LLP

(57) ABSTRACT

A demodulation circuit for demodulating a frequency diverse complex modulated carrier comprises an A/D converter generating a series of samples representing the modulated carrier, a mixer operating to mix the series of samples with a sine wave of one fourth the sampling frequency represented by a series of sine wave values occurring at the sampling frequency, and a decimation filter operating at a decimation factor equal to the sampling frequency divided by the frequency difference between adjacent sub-spectra for folding the sub-spectra and retaining a portion of the mixed down series of samples.

11 Claims, 4 Drawing Sheets

METHOD AND APPARATUS FOR MIXING DOWN AND SPECTRUM FOLDING FREQUENCY DIVERSE MODULATED CARRIER

TECHNICAL FIELD

The present invention relates generally to network interfacing, and more particularly, to an apparatus and method for mixing down and spectrum folding a frequency diverse modulated carrier to baseband in a network communications receiver.

BACKGROUND OF THE INVENTION

The transmission of various types of digital data between computers continues to grow in importance. The predominant method of transmitting such digital data includes coding the digital data into a low frequency baseband data signal and modulating the baseband data signal onto a high frequency carrier signal. The high frequency carrier signal is then transmitted across a network physical transmission medium such as electrical cable, fiber optic, RF, or other medium to a remote computing station.

At the remote computing station, the high frequency carrier signal must be received and demodulated to recover the original baseband signal. In the absence of any distortion across the network medium, the received signal would be identical in phase, amplitude, and frequency to the transmitted carrier and could be demodulated using known mixing techniques to recover the baseband signal. The baseband signal could then be recovered into digital data using known sampling algorithms.

One problem with such networks is that the physical medium and network topology tend to distort the high frequency carrier signal. Branch connections and different lengths of such branches cause reflections of the transmitted signal. Such problems are even more apparent in a network which uses home telephone wiring cables as the network physical medium. The typical wiring of the telephone network is designed for the "plain old telephone service" (POTS) signals in the 3–10 kilohertz frequency and are not designed for transmission of high frequency carrier signals in a frequency range greater than 1 MHz. The high frequency carrier signal is also distorted by transients in wiring characteristics due to on-hook and off-hook switching and noise pulses of the POTS (e.g. ringing). The high frequency carrier is further distorted by spurious noise caused by electrical devices operating in close proximity to the "cable" medium.

Such distortion of frequency, amplitude, and phase of the high frequency carrier signal degrades network performance and tends to impede the design of higher data rate networks. Known techniques for compensating for such distortion and improving the data rate of a network include complex modulation schemes and frequency diversity.

Utilizing a complex modulation scheme such as quadrature amplitude modulation (QAM), both the amplitude and phase of the high frequency carrier are modulated to represent I and Q components of a baseband signal. Referring to FIG. 1, a 4-QAM modulation constellation 10 is shown. In operation, each data symbol is represented by an I-value of +1 or −1 and a Q-value of +1 or −1 such that the data symbol can be represented by one of the four states 12(a)–(d) in constellation 10. Each constellation point y 12(a)–12(d) represents a unique combination of carrier amplitude and phase. For example, constellation point 12(a) represents a carrier amplitude of 14 and a carrier phase 16.

FIG. 2 illustrates the utilization of frequency diversity by transmitting the same data in three mutually exclusive sub-spectra 18(a)–(c) of the transmission band 20. Therefore, if a portion of the band is distorted (e.g. one or more of the sub-spectra 18(a)–(c)), the data may still be recovered at the receiver from a less distorted portion of the sub-spectra 18(a)–(c). For example, a data signal modulated onto a 7 MHz carrier utilizing 6 MHz of bandwidth may include three mutually exclusive sub-bands 18(a)–(c) centered at 5 MHz, 7 MHz and 9 MHz.

One approach to demodulating such complex signals is to use filters implemented by digital signal processing (DSP), which provides for a convenient way of varying filter coefficients for each transmission to accommodate carrier distortion as detected in the particular time frame in which the data is being transmitted. Using such approach, the receiver compares the distorted received signal representing a known preamble transmission (prior to the data transmission) to the undistorted waveform of the preamble and determines the appropriate filter coefficients for recovery of the received signal. Such filter coefficients are then used for receiving the data transmission.

In accordance with DSP technology, the high frequency carrier is typically sampled with an A/D converter at a rate that is at least 4 times the carrier frequency. Assuming a carrier frequency on the order of 7 MHz, the sampling rate will be on the order of 30 MHz. A problem associated with processing digital samples at such rates to demodulate a complex modulated carrier, and to process mutually exclusive sub-bands of a frequency diverse system, is that very large and costly digital signal processing systems would be required. Therefore, based on recognized industry goals for size and cost reductions, what is needed is a device and method for recovering data signals from a received modulated carrier that do not suffer from the complexity disadvantages of known systems.

SUMMARY OF THE INVENTION

A first objective of the present invention is to provide a demodulation circuit comprising: a) an A/D converter running at a sampling frequency and generating a series of samples representing a frequency diverse modulated carrier; b) a mixer operating to mix the series of samples with a sine wave of one fourth the sampling frequency, represented by a series of sine wave values occurring at the sampling frequency, the mixer generates a mixed down signal of a series of samples occurring at the sampling frequency; and c) a decimation filter operating at a decimation factor equal to the sampling frequency divided by the frequency difference between adjacent sub-spectra for folding the sub-spectra and retaining a portion of the mixed down series of samples. The portion of the mixed down series of samples may occur at a slow sampling rate equal to the sampling rate divided by the decimation factor of the decimation filter.

The sine wave may have the same frequency as the modulated carrier such that the mixed down series of samples represents the original frequency diverse baseband signal. Alternatively, the sine wave may have a frequency other than that of the modulated carrier and the circuit may further comprise a second mixer operating to mix the portion of the mixed down series of samples with a second sine wave represented by a second series of sine wave values occurring at the slow sampling rate, the second mixer generating the baseband signal.

The mixed down series of samples may represent the I-channel of a system having complex constellation points.

The system may further comprise: d) a Q-channel mixer operating to mix the series of samples with a cosine wave of one fourth the sampling frequency represented by a series of cosine wave values occurring at the sampling frequency, the Q-channel mixer generating a mixed down series of samples occurring at the sampling frequency; and e) a Q-channel decimation filter operating at a decimation factor equal to the sampling frequency divided by the frequency difference between adjacent sub-spectra for folding the sub-spectra and retaining a portion of the mixed down series of samples. Both the sine wave and the cosine wave may have the same frequency as the modulated carrier such that both the sine mixed down series of samples and the cosine mixed down series of samples represent the I-channel and the Q-channel of a frequency diverse baseband signal respectively. Alternatively, both the sine wave and the cosine wave may have a frequency other than that of the modulated carrier and the circuit may further comprise: f) a second mixer operating to mix the portion of the mixed down series of samples with a second sine wave represented by a second series of sine wave values occurring at the slow sampling rate, the second mixer generating a baseband signal; and g) a second Q-channel mixer operating to mix the portion of the cosine mixed down series of samples with a second cosine wave represented by a second series of cosine wave values occurring at the slow sampling rate, the second Q-channel mixer generating a baseband Q-channel signal.

Preferably, the sample frequency is 32 MHz, both the sine wave and the cosine wave have a frequency of 8 MHz, the decimation filter has a decimation factor of 16:1, and both the second sine wave and the second cosine wave have a frequency of 1 MHz.

A second objective of the present invention is to provide a method of folding adjacent sub-spectra of a frequency diverse modulated carrier signal, the method comprising: (a) selecting a sample frequency that is a multiple of the difference between adjacent sub-spectra; (b) sampling the modulated carrier at the sampling frequency to generate a series of samples; and (c) decimating the series of samples utilizing a decimation filter with a decimation factor equal to the sample frequency divided the difference between adjacent sub-spectra to generate a decimated series of samples. The method may further comprise mixing the series of samples with a sine wave with a frequency equal to that of the modulated carrier and represented by a series of values occurring at the sample frequency to down mix the modulated carrier to a baseband signal. The method may further yet include mixing the decimated series of samples with a second sine represented by a series of values occurring at the same frequency as that of the decimated series of samples to mix the decimated series of samples to baseband.

DESCRIPTION OF THE PREFERRED EMBODIMENTS

Figure 1:
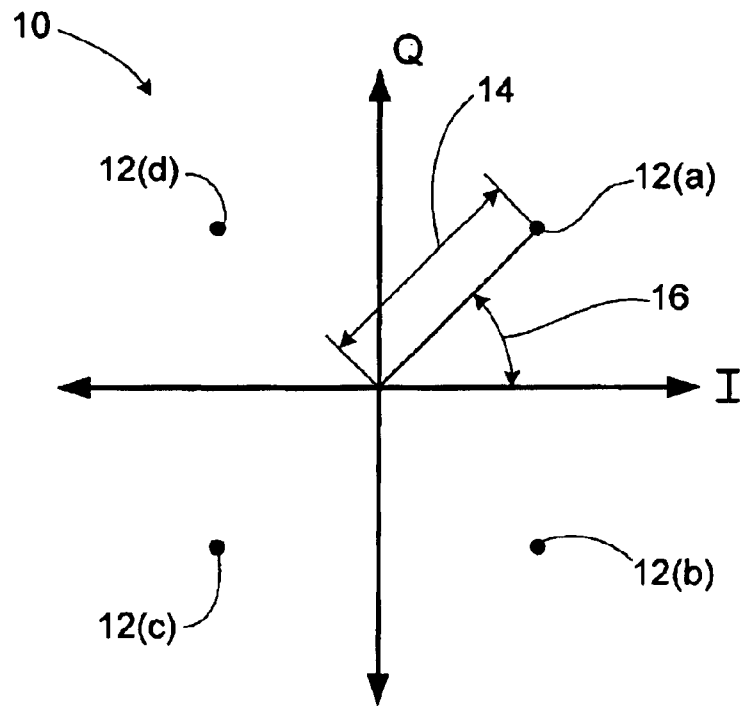
FIG. 1 is a diagram of a complex modulation constellation useful in the practice of the present invention.

The present invention will now be described in detail with reference to the drawings. In the drawings, like reference numerals are used to refer to like elements throughout.

Figure 3:
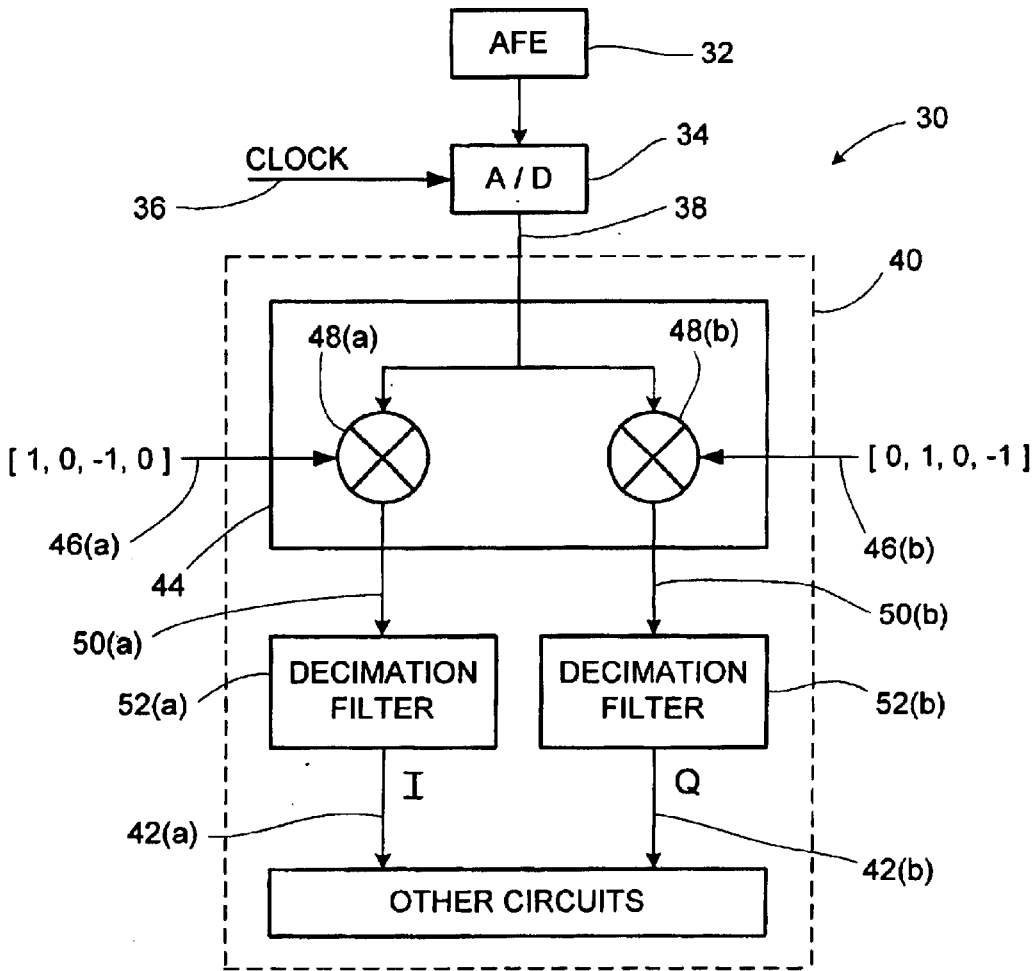
FIG. 3 is a block diagram of a first embodiment of a device for recovery of baseband signals in accordance with the present invention.

Referring to FIG. 3, a block diagram of a first embodiment of a device 30 of this invention for recovering baseband I and Q-signals from a frequency diverse quadrature amplitude modulated (QAM) carrier is shown. Device 30 includes analog front end 32 which includes known analog circuits tuned to the modulated carrier frequency for receiving a carrier signal from the transmission medium and amplifying such signal as appropriate for sampling by AND converter 34. In the preferred embodiment A/D converter 34 is an 10-bit A/D converter. In this first embodiment, the A/D converter 34 is driven by a sampling clock signal 36 with a frequency that is four-times that of the modulated carrier frequency. The output of the A/D converter 34 is a digitized carrier signal 38 comprising a sequence of 10-bit sample values at a sample frequency that is four-times that of the modulated carrier frequency (e.g. a 7 MHz modulated carrier is sampled by an A/D converter clocked at 28 MHz such that the digitized carrier signal 38 is a sequence of sample values at a rate of 28 MHz). The digitized carrier signal 38 is then processed by a demodulator 40 for recovery of the baseband I and Q-signals 42(a) and 42(b), respectively, in accordance with a first embodiment of this invention.

The demodulator 40 includes mixer 44 for separating the I and Q-channels from the digitized carrier signal 38. Mixer 44 includes an I-channel mixer 48(a) which mixes the digitized carrier signal 38 with a sequence of values representing a digitized sine wave 46(a). In this first embodiment, the digitized sine wave 46(a) has a frequency equal to the carrier frequency such that mixer 48(a) mixes the digitized carrier signal 38 down to a frequency diverse baseband signal 50(a). Because the present invention uses digital signal processing, the digitized sine wave 46(a) must be represented by a sequence of digital values clocked at the same frequency as the sample frequency (e.g. four-times the modulated carrier frequency) such that mixer 48(a) is simply a multiplier. It should be appreciated that the digitized sine wave 46(a) can be represented by a repetitive sequence of values [1,0,−1,0] clocked at four-times the digitized sine wave 46(a) frequency. As such, the DSP hardware for performing the multiplication can be significantly simplified. For example, in this first embodiment a 7 MHz modulated carrier is represented by a series of samples clocked at 28 MHz and is mixed down by mixing with a 7 MHz digitized sine wave represented by a repetitive sequence of [1,0,−1,0] which is also clocked at 28 MHz.

Figure 2:
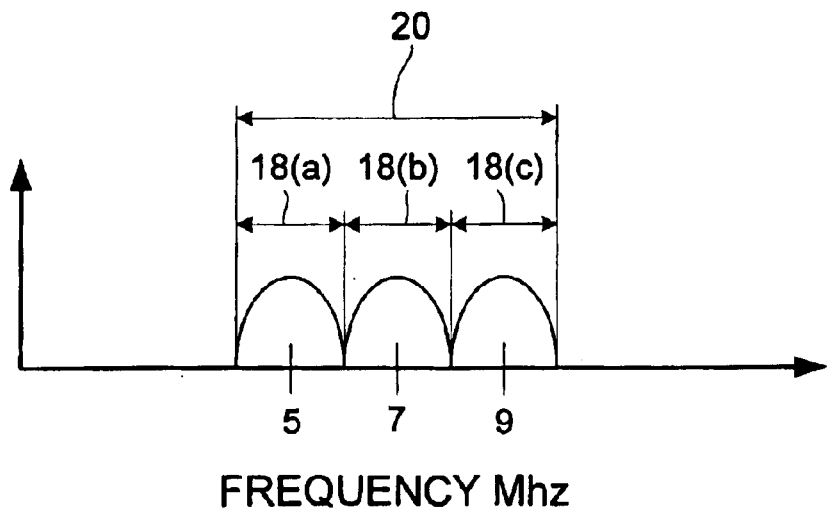
FIG. 2 is a frequency domain diagram of a frequency diverse signal useful in the practice of the present invention.

The frequency diverse baseband signal 50(a) is input to a decimation filter 52(a). The purpose of the decimation filter 52(a) is to reduce the sample frequency and fold the three mutually exclusive sub-spectra 18(a)–(c) (FIG. 2) to the baseband I-signal 42(a). It should be appreciated that a sampling frequency that matches the frequency difference between the centers of the three sub-spectra 18(a)–(c) (FIG. 2) will cause the folding the frequency diverse baseband signal 50(a) into the baseband I-signal 42(a). Therefore, wherein the centers of the three sub-spectra 18(a), 18(b), and 18(c) are at 5 MHz, 7 MHz, and 9 MHz respectively, a sampling frequency of 2 MHz will achieve the desired folding.

As such, in the first embodiment wherein the frequency diverse baseband signal 50(a) is a series of samples clocked at a 28 MHz sampling frequency and the sampling frequency needed for folding the three sub-spectra is a 2 MHz series of values, the decimation filter 52(a) must operate at a 14:1 decimation factor such that the output is the baseband I-signal 42(a) represented as a series of samples clocked at 2 MHz.

In operation, decimation filter 52(a) functions to pass every $14^{th}$ value and ignore the remaining values and as such converts a 28 MHz sample frequency to a 2 MHz sample frequency. It should be appreciated that the output of the decimation filter 52(a) will have a better signal to noise ratio if the phase of the decimation filter 52(a) is in phase with the local maxima and minima of the frequency diverse baseband signal 50(a). Or, stated another way, that the retained values are generally aligned with the peaks and troughs of the frequency diverse baseband signal 50(a) and the non-peak and non-trough values are the values that are ignored or decimated. It should be appreciated that because the frequency diverse baseband signal 50(a) is baseband, the period of the frequency diverse baseband signal 50(a) matches the period of the data symbols communicated thereon.

Figure 4:
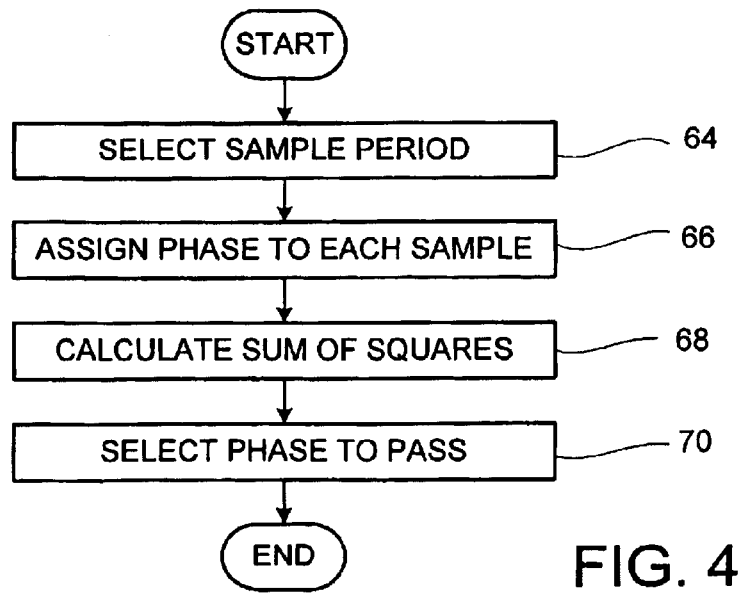
FIG. 4 is a flowchart showing a method of determining the phase of a decimation filter in accordance with one embodiment of this invention.
Figure 5:
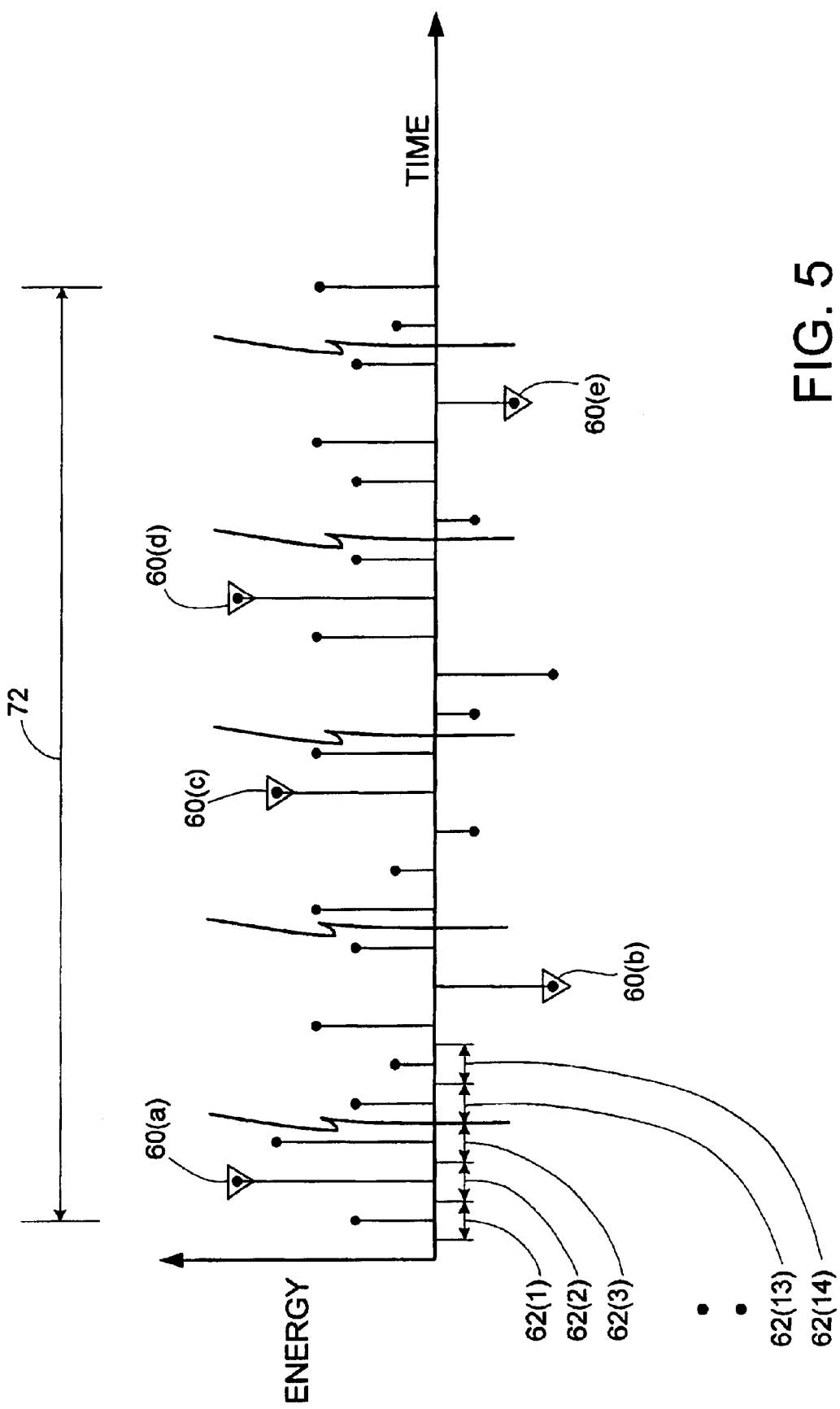
FIG. 5 is a time domain diagram showing a method of determining the phase of a decimation filter in accordance with one embodiment of this invention.

Referring to the flowchart of FIG. 4 and the diagram of FIG. 5, a method for setting the phase of the decimation filter 52(a) is shown. Samples 60(a)–(e) are in a retained phase group 62(2) while the remaining samples are in the decimated phase groups. The decimation filter has a total quantity of phase groups 62(1)–(14) that matches the decimation factor (e.g. 14:1) such that samples in the retained phase group (e.g. samples 60(a)–(e) in the phase group 62(2)) may be retained while the samples in the remaining phase groups are decimated.

At step 64, a sample time period 72 is selected. The sample time period 72 is the period in which sample values are analyzed to select the retained phase group.

At step 66, each sample is determined to be in one of the phase groups 62(1)–62(14). Next, at step 68, a sum-of-the-squares value is calculated for each phase group 62(1)–(14). The sum-of-the-squares value or each phase group 62(1)–(14) is equal to the summation of the square of the value of each sample in the sample period that is in that particular phase group.

At step 70, the sum-of-the-squares value for each phase group is compared to the other phase groups and the phase group with the highest sum-of-the-squares value is selected as the retained phase group. In the example of FIG. 5, phase group 62(2) would have the highest sum of the squares value and is therefore becomes the retained phase group while the remaining phase groups are ignored.

The above described systems and methods effectively recover a baseband I-signal from a frequency diverse QAM carrier signal. Referring again to FIG. 3, the systems and methods for recovery of the baseband Q-signal 42(b) are identical to the above described systems and method for recovery of the baseband I-signal 42(a) except that the digitized carrier signal 38 is mixed down with a digital cosine waveform at the carrier frequency rather than the digitized sine waveform used for recovery of the baseband I-signal 42(a). More specifically, digitized carrier signal 38 is fed to mixer 48(b) which functions identically to mixer 48(a) except that it operates to mix digitized carrier signal 38 with a digitized cosine signal 46(b) to yield frequency diverse baseband signal 50(b). Frequency diverse baseband signal 50(b) is fed to a decimation filter 52(b) which functions identically to the decimation filter 52(a) to fold the sub-spectra of frequency diverse baseband signal 50(b) into baseband Q-signal 42(b).

Figure 6:
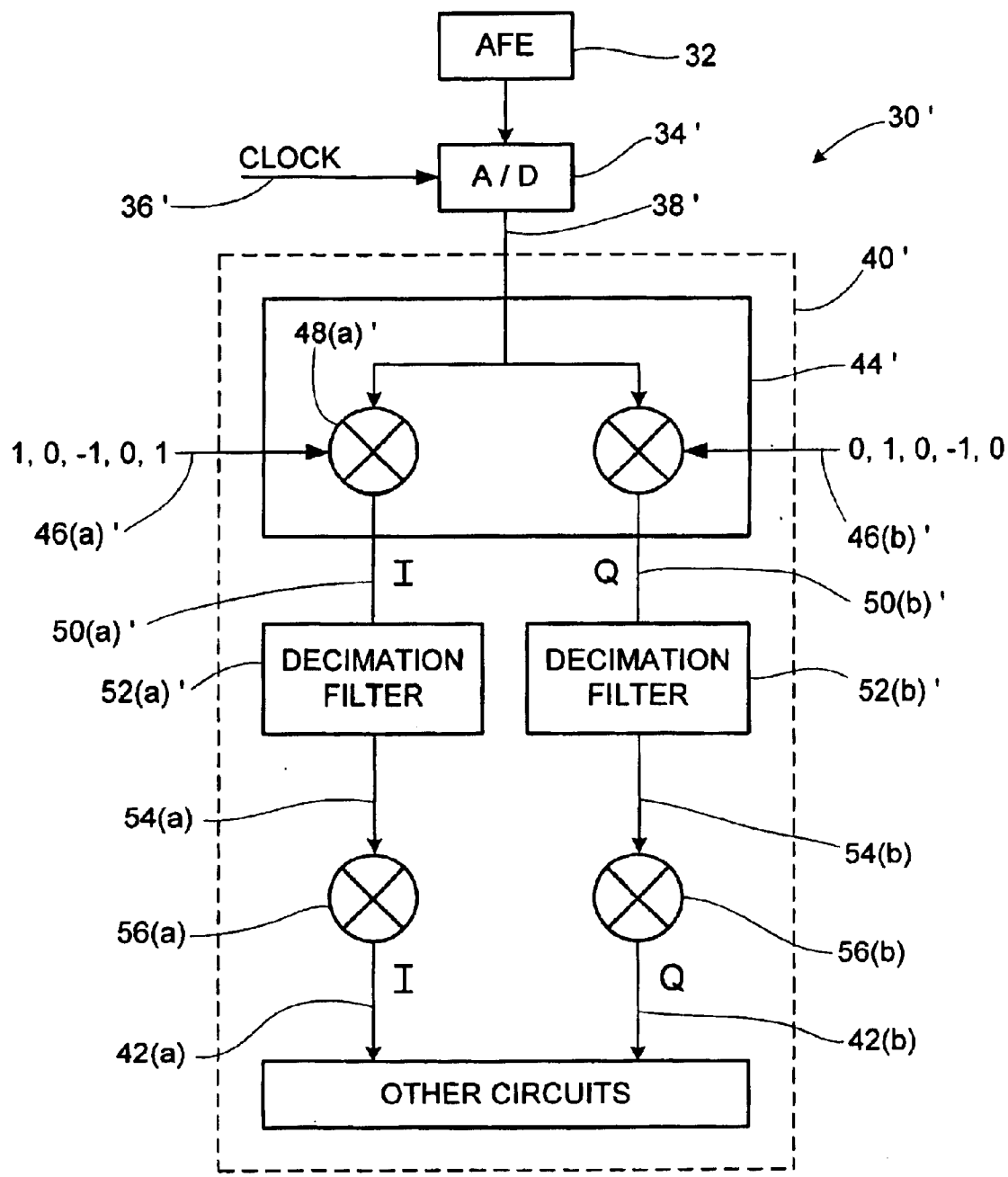
FIG. 6 is a block diagram of a second embodiment of a device for recovery of baseband signals in accordance with the present invention.

In a second embodiment of this invention it is recognized that, because of various design considerations, it is not always preferable to sample the modulated carrier at four-times the carrier frequency. FIG. 6 shows a second embodiment of a device 30' wherein the modulated carrier is sampled by A/D converter 34' at a sampling frequency that is greater than four-times that of the modulated carrier. More specifically, device 30' includes analog front end 32 which, like in the first embodiment, includes known analog circuits tuned to the modulated carrier frequency for receiving a carrier signal from a transmission medium and amplifying such signal as appropriate for sampling by A/D converter 34'. Again, A/D converter 34' is preferably a 10-bit A/D converter and, in this exemplary embodiment wherein the modulated carrier is a 7 MHz signal, the A/D converter is driven by a 32 MHz clock signal 36' such that the output of the A/D converter 34' is a digitized carrier signal 38' comprising a sequence of 10-bit sample values clocked at a sampling frequency of 32 MHz. The digitized carrier signal 38' is then coupled to a demodulator 40' for recovery of the baseband I and Q-signals 42(a) and 42(b) in accordance with this second embodiment of this invention.

The demodulator 40' includes mixer 44' for separating the I and Q-channels from the digitized carrier signal 38'. Mixer 44' includes an I-channel mixer 48(a)' which mixes the digitized carrier signal 38' with a sequence of values representing a digitized sine wave 46(a)'. In this second embodiment, the digitized sine wave 46(a)' has a frequency equal to one-fourth that of the sample frequency such that the digitized sine wave 46(a)' may be represented by a sequence of digital values [1,0,−1,0] clocked at the sample frequency. For example, an 8 MHz sine wave can be represented by the sequence of digital values [1,0,−1,0] clocked at 32 MHz which matches the sample frequency such that mixer 48(a)' is a hardware simple multiplier. It should be appreciated that in this second embodiment, the output of mixer 48(a)' is not the frequency diverse baseband signal because it has been mixed down by 8 MHz as where recovery of baseband requires mixing down by 7 MHz and as such will be called the frequency diverse mixed down signal 50(a)'.

The frequency diverse mixed down signal 50(a)' is input to a decimation filter 52(a)'. Again, the purpose of the decimation filter 52(a)' is to reduce the sample frequency and fold the three mutually exclusive sub-spectrums 18(a)–(c) (FIG. 2) together. Again, a sampling frequency that matches the frequency difference between the centers of the three sub-spectrums 18(a)–(c) will result in the folding of the three sub-spectrums in the frequency diverse mixed down signal 50(a)' into an I-channel mixed down signal 54(a). As such, in the preferred embodiment where the centers of the three sub-spectra 18(a), 18(b), and 18(c) are at 5 MHz, 7 MHz, and 9 MHz respectively, a sampling frequency of 2 MHz will achieve the desired folding. To achieve a 2 MHz sampling rate, the decimation filter will operate at a 16:1 decimation factor.

Similar to the first embodiment, it should be appreciated that the output of the decimation filter 52(a)' will be a stronger signal if the decimation is in phase with the local maxima and minima of the frequency diverse mixed down signal 50(a)'. As such, the same method for selecting a decimation phase as previously discussed with respect to FIGS. 4 and 5 will be used to set the phase of decimation filter 52(a)' in this second embodiment. It should be appreciated that because frequency diverse mixed down signal 50(a)' is not baseband, the period of the signal will be other than the period of the data symbols communicated thereon.

The I-channel mixed down signal 54(a) is fed to a second I-channel mixer 56(a). As previously discussed, in this second embodiment, the I-channel mixed down signal 54(a) is not a baseband signal because it was mixed down by an 8 MHz digitized sine wave 46(a)' rather than by a 7 MHz sine wave (e.g. matching the carrier frequency) that would have mixed down the digitized carrier signal 38 to baseband. To recover baseband in this second embodiment, the I-channel mixed down signal 54(a) will need to be mixed up with a 1 MHz digitized sine wave by the second I-channel mixer 56(a).

Because the I-channel mixed down signal 54(a) has a 2 MHz sampling frequency, the 1 MHz digitized sine wave also must be represent by a 2 MHz sequence of values, which would be a repetitive sequence of [1,−1]. The output of second mixer 56(a) is thus the baseband I-signal 42(a).

Again, the above described systems and methods of this second embodiment effectively recover a baseband I-signal 42(a) from a frequency diverse QAM carrier signal. The systems and methods for recovery of the baseband Q-signal 42(b) are identical to the above described systems and method for recovery of the baseband I-signal 42(a) except that the digitized carrier signal 38' is mixed down with a one-fourth sampling frequency digitized cosine wave 46(b)' rather than the one-fourth sampling frequency digitized sine wave 46(a)' used to mix down the I-channel. More specifically, digitized carrier signal 38' is fed to mixer 48(b)' which functions identically to mixer 48(a)' except that it operates to mix digitized carrier signal 38' with a digitized cosine signal 46(b)' to yield frequency diverse base mixed down signal 50(b)'. Frequency diverse mixed down signal 50(b)' is fed to a decimation filter 52(b)' which functions identically to decimation filter 52(a)' to fold the sub-spectra of frequency diverse mixed down signal 50(b)' to yield a Q-channel mixed down signal 54(b). The Q-channel mixed down signal 54(b) is fed to a second Q-channel mixer 56(b) wherein the Q-channel mixed down signal 54(b) is mixed with a 1 MHz digitized cosine wave, represented by a repetitive sequence [−1,1] clocked at 2 MHz, to yield the baseband Q-signal 42(b)'.

The above described systems and methods provide for a DSP implementation of spectrum folding and reduction of a high frequency sampling rate to a significantly lower sampling rate, and provide for demodulating a frequency diverse modulated data signal with reduction in hardware complexity and size over known systems. Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A demodulation circuit comprising:
    a) an A/D converter, running at a sampling frequency, generating a series of samples representing a frequency diverse modulated carrier;
    b) a mixer operating to mix the series of samples with a sine wave of one fourth the sampling frequency, represented by a series of sine wave values occurring at the sampling frequency, the mixer generating a mixed down series of samples occurring at the sampling frequency; and
    c) a decimation filter operating at a decimation factor equal to the sampling frequency divided by the frequency difference between adjacent sub-spectra for folding the sub-spectra and retaining a portion of the mixed down series of samples.

2. The demodulation circuit of claim 1, wherein the portion of the mixed down series of samples occurs at a slow sampling rate equal to the sampling rate divided by the decimation factor of the decimation filter.

3. The demodulation circuit of claim 2, wherein the sine wave has the same frequency as the modulated carrier such that the mixed down series of samples represents a frequency diverse baseband signal.

4. The demodulation circuit of claim 2, wherein the sine wave has a frequency other than that of the modulated carrier and the circuit further comprises a second mixer operating to mix the portion of the mixed down series of samples with a second sine wave represented by a second series of sine wave values occurring at the slow sampling rate, the second mixer generating a baseband signal.

5. The demodulation circuit of claim 2, wherein the mixed down series of samples represents the I-channel of a system having complex constellation points and the system further comprising:
    d) a Q-channel mixer operating to mix the series of samples with a cosine wave of one fourth the sampling frequency represented by a series of cosine wave values occurring at the sampling frequency, the Q-channel mixer generating a cosine mixed down series of samples occurring at the sampling frequency; and
    e) a Q-channel decimation filter operating at a decimation factor equal to the sampling frequency divided by the frequency difference between adjacent sub-spectra for folding the sub-spectra and retaining a portion of the cosine mixed down series of samples.

6. The demodulation circuit of claim 5, wherein both the sine wave and the cosine wave have the same frequency as the modulated carrier such that both the mixed down series of samples and the cosine mixed down series of samples represent the I-channel and the Q-channel of a frequency diverse baseband signal respectively.

7. The demodulation circuit of claim 5, wherein both the sine wave and the cosine wave have a frequency other than that of the modulated carrier and the circuit further comprises:
    f) a second mixer operating to mix the portion of the mixed down series of samples with a second sine wave represented by a second series of sine wave values occurring at the slow sampling rate, the second mixer generating a baseband signal; and
    g) a second Q-channel mixer operating to mix the portion of the cosine mixed down series of samples with a second cosine wave represented by a second series of cosine wave values occurring at the slow sampling rate, the second Q-channel mixer generating a baseband Q-channel signal.

8. The demodulation circuit of claim 7, wherein the sample frequency is 32 MHz, both the sine wave and the cosine wave have a frequency of 8 MHz, the decimation filter has a decimation factor of 16:1, and both the second sine wave and both the second cosine wave have a frequency of 1 MHz.

9. A method of folding adjacent sub-spectra of a frequency diverse modulated carrier signal, the method comprising:
    (a) selecting a sample frequency that is a multiple of the difference between adjacent sub-spectra;

(b) sampling the modulated carrier at the sampling frequency to generate a series of samples; and (c) decimating the series of samples utilizing a decimation filter with a decimation factor equal to the sample frequency divided the difference between adjacent sub-spectra to generate a decimated series of samples.

10. The method of folding adjacent sub-spectra of the frequency diverse modulated carrier signal of claim 9, further comprising mixing the series of samples with a sine wave with a frequency equal to that of the modulated carrier and represented by a series of values occurring at the sample frequency to down mix the modulated carrier to a baseband signal.

11. The method of folding adjacent sub-spectra of the frequency diverse modulated carrier signal, of claim 9, further including mixing the decimated series of samples with a second sine represented by a series of values occurring at the same frequency as that of the decimated series of samples to mix the decimated series of samples to baseband.

* * * * *